(12) United States Patent
Takeuchi

(10) Patent No.: US 7,508,117 B2
(45) Date of Patent: Mar. 24, 2009

(54) PIEZOELECTRIC ACTUATOR, IMAGING ELEMENT MOVING DEVICE USING THE SAME, AND IMAGING DEVICE USING THE SAME

(75) Inventor: Yusuke Takeuchi, Kanagawa (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/662,916

(22) PCT Filed: Oct. 18, 2005

(86) PCT No.: PCT/JP2005/019118

§ 371 (c)(1),
(2), (4) Date: Mar. 15, 2007

(87) PCT Pub. No.: WO2006/043549

PCT Pub. Date: Apr. 27, 2006

(65) Prior Publication Data

US 2007/0284968 A1    Dec. 13, 2007

(30) Foreign Application Priority Data

Oct. 19, 2004   (JP) .............................. 2004-304013

(51) Int. Cl.
*H01L 41/083* (2006.01)
(52) U.S. Cl. .................... 310/328; 310/332; 200/181
(58) Field of Classification Search .................. 310/332
See application file for complete search history.

(56) References Cited

U.S. PATENT DOCUMENTS 5,734,107 A * 3/1998 Boehm et al. ............ 73/514.34
5,889,354 A * 3/1999 Sager ......................... 310/331
6,246,834 B1 * 6/2001 Onda .......................... 396/85

FOREIGN PATENT DOCUMENTS

| JP | 63-15679 | | 1/1988 |
| JP | 5-304324 | A | 11/1993 |
| JP | 6-67223 | B2 | 8/1994 |
| JP | 2548509 | | 5/1997 |
| JP | 2000-307937 | A | 11/2000 |
| JP | 2003-32537 | A | 1/2003 |

* cited by examiner

*Primary Examiner*—Thomas M Dougherty
*Assistant Examiner*—Bryan P Gordon
(74) *Attorney, Agent, or Firm*—McDermott Will & Emery LLP

(57) ABSTRACT

To implement a piezoelectric actuator which can actuate a large object, such as an imaging element, in a predetermined direction at high power without involvement of rotational displacement; which can ensure a large amount of actuation; which is suitable for miniaturization and weight reduction; and which is advantageous in terms of mechanical durability and manufacturing cost.

A piezoelectric actuator having a well-balanced mechanical structure is obtained by means of stacking a plurality of cross units, in each of which a pair of bimorph piezoelectric elements (21a and 21b, 21c and 21d) are crossed in the form of the letter X, into two layers (an even number of layers), and fixing the thus-stacked cross units. An imaging element 11 is stably supported by means of two movable ends (C-1, C-2) provided at the extremity of the piezoelectric actuator.

18 Claims, 8 Drawing Sheets

PIEZOELECTRIC ACTUATOR, IMAGING ELEMENT MOVING DEVICE USING THE SAME, AND IMAGING DEVICE USING THE SAME

RELATED APPLICATIONS

This application is the U.S. National Phase under 35 U.S.C. §371 of International Application No. PCT/JP2005/019118, filed on Oct. 18, 2005, which in turn claims the benefit of Japanese Application No. 2004-304013, filed on Oct. 19, 2004, the disclosures of which Applications are incorporated by reference herein.

FIELD OF THE INVENTION

The present invention relates to a piezoelectric actuator, an imaging element moving device using the same, and an imaging device using the same.

BACKGROUND OF THE INVENTION

A bimorph piezoelectric actuator is available as one type of piezoelectric actuator.

The bimorph piezoelectric actuator is an electronic component which utilizes, as a mechanical drive source, a bimorph piezoelectric element (hereinafter also called a "bimorph element").

The bimorph element has a structure where two thin plates of piezoelectric ceramic polarized in a thicknesswise direction are laminated together; planar electrodes are embedded in adhesion surfaces of the respective thin plates of piezoelectric ceramic; and at least one electrode is attached to each of the front and back surfaces (outwardly-exposed principal surfaces) of each of the thin plates of piezoelectric ceramic.

Piezoelectric ceramic is a ceramic material which possesses a piezoelectric effect characteristic and is obtained by adding barium titanate, strontium titanate, lead zirconate titanate (PZT), lithium niobate (LiNbO$_3$), or the like, to alumina (aluminum oxide), magnesia (magnesium oxide), silica (silicon dioxide), or the like, which is a common ceramic material, and sintering the mixture.

When a voltage is applied to the respective thin plates of piezoelectric ceramic constituting the bimorph element, one thin plate of piezoelectric ceramic extends by means of a piezoelectric effect, and the other thin plate of piezoelectric ceramic contracts by means of the same. As a result, a bend (flexion) arises in the bimorph element, and displacement arises in an end (a movable end) of the bimorph element. The displacement having arisen in the end (movable end) of the bimorph element can be utilized for mechanical actuation of another mechanical element.

The bimorph piezoelectric actuator is superior to a laminated piezoelectric actuator, in that it has a greater amount of displacement, lower power consumption, a faster response speed, and superior durability.

Meanwhile, the electromotive force (output power) developing in the bimorph piezoelectric actuator is small, and hence this bimorph piezoelectric actuator has hitherto been used for adjusting tracking of a VTR head, or the like.

In view of recent promotion of miniaturization, slimming-down, and weight reduction of electronic cameras such as video cameras, electronic still cameras, and the like, (including cameras incorporated into portable cellular phones and PDAs), the piezoelectric actuator has been used as a mechanical drive source of an imaging element.

For instance, a hand movement prevention mechanism for adjusting a focus by means of axially actuating an imaging element (a CCD or the like) by means of a piezoelectric actuator instead of actuation of a focus lens has been put forward (e.g., see Patent Documents 1 and 2). In Patent Document 2, a bimorph piezoelectric actuator is used as a mechanical drive source of the imaging element.

Patent Document 1 describes an embodiment where a piezoelectric actuator is connected directly to an imaging element and an embodiment where the displacement incited by the piezoelectric actuator is increased by means of a displacement-increasing mechanism using a leaf spring; and where an imaging element is actuated by means of restoration force of the leaf spring.

Patent Document 2 adopts a configuration where the displacement incited by the piezoelectric actuator is transmitted to an imaging element by way of an elastic flexible printed board; and where the displacement of the piezoelectric actuator is increased by means of restoration force of the flexible printed board.

Patent Document 1: JP-A-2000-307937
Patent Document 2: JP-A-2003-32537

DISCLOSURE OF THE INVENTION

Problem that the Invention is to Solve

The techniques described in Patent Documents 1, 2 encounter the following drawbacks when applied to equipment which is strictly desired to be made compact and light-weight, such as a digital camera, a portable cellular phone, or the like.

(1) and (2) are considerations pertaining to a configuration where piezoelectric actuators are connected in series (FIG. 2 of Patent Document 1); (3) and (4) are considerations pertaining to a configuration for increasing the displacement of a piezoelectric actuator by use of a displacement-increasing mechanism; and (5) is a consideration which is common to these configurations.

(1) Viewpoint of the Range of Actuation of an Imaging Element

Specifically, in the case—described in Patent Document 1—where the piezoelectric actuator is connected directly to the imaging element, there may often arise a case where a sufficient range of actuation of an imaging element cannot be ensured. The amount of displacement of the piezoelectric actuator is not sufficient in view of position control of the imaging element. When the imaging element is actuated directly by means of the piezoelectric actuator, a sufficient range of actuation of the imaging element cannot ensured. For this reason, there may arise a case where sufficient focusing capability (focus adjustment function) cannot be obtained.

(2) Viewpoint of the Magnitude of an Output

In contrast with actuation of a magnetic head or the like, the imaging element is large (or heavy), and mechanical actuation of the imaging element requires a considerably high output. It is difficult for a single piezoelectric actuator to produce such high power.

(3) Miniaturization Viewpoint

According to the techniques that are described in Patent Documents 1 and 2 and use the displacement-increasing mechanism (the techniques for increasing the displacement of the piezoelectric actuator through use of a leaf spring or a flexible printed board), a sufficient range of actuation of the imaging element can be ensured, and a high output can also be expected. However, presence of the displacement-increasing mechanism imposes a limitation on miniaturization. Particularly, the entirety of a camera incorporated into a portable cellular phone must be miniaturized. The width of a piezoelectric actuator plate used for translating an imaging element must be made equal to the thickness of the imaging element. Utilizing the displacement-increasing mechanism poses a hindrance against meeting such a strict demand for miniaturization.

(4) Viewpoints of Mechanical Durability, Ease of Manufacture, and the Like

The configuration for transmitting the displacement of the piezoelectric actuator in an increased manner to an imaging element by way of the displacement-increasing mechanism is originally complicated, and maintaining the accuracy of displacement will become difficult unless interfacing among the members is well adjusted. In view that characteristics of the respective members deteriorate with elapse of time, the configuration may be said to become disadvantageous in terms of mechanical durability. There may also arise a case where an increase in the number of components renders assembly and manufacture of the displacement increasing mechanism complicated, making the configuration disadvantageous in terms of cost.

(5) Viewpoint for Accurate Actuation of an Imaging Element in the Direction of an Optical Axis Since equipment of an optical system is designed with emphasis on the optical axis, an imaging element must be actuated along the optical axis in an extremely accurate manner. Particularly, the important point for actuation of the imaging element is linear actuation of the imaging element along the optical axis. If the actuating direction of the imaging element has deviated upon receipt of rotational stress, accurate focusing control cannot be attained. When such a concern arises, the actuating direction of the imaging element must be forcefully regulated by provision of a guide member. However, a loss corresponding to occurrence of friction with the guide member is assumed to arise in the force for actuating the imaging element (i.e., the efficiency of actuating force is deteriorated), and presence of the guide member is presumed to hinder miniaturization or weight reduction of the equipment.

As mentioned above, when the piezoelectric actuator is used as a drive source for controlling the position of the imaging element, rigorous pursuit of miniaturization, weight reductions, performance, cost reductions, and the like renders problems obvious.

Growing demand exists for miniaturization, weight reduction, improved performance, and cost-cutting of present portable cellular phones and digital cameras. In consideration of these respects, overcoming all the drawbacks (1) to (5) is vital.

In association with a recent increase in the number of pixels (resolution) of an imaging element, realization of a compact, high-power actuator capable of effecting highly-accurate, high-speed position control for preventing occurrence of hand movements is especially desired. However, overcoming all the drawbacks (1) to (5) is difficult under the present circumstances.

The present invention has been conceived in light of these considerations, and aims at materializing a piezoelectric actuator which has superior characteristics; which can linearly actuate a large objective, such as an imaging element, at high power in a predetermined direction without involvement of occurrence of a rotational displacement; which can also ensure a large amount of actuation; and which is suitable for miniaturization and weight reduction and becomes advantageous in terms of mechanical durability and manufacturing cost.

Means for Solving the Problems

A piezoelectric actuator of the present invention has a structure where a plurality of bimorph piezoelectric element cross units, into each of which a pair of bimorph piezoelectric elements are crossed into a form of a letter X, are stacked into an even number and fixed together.

In the present invention, a mechanical structure is formed by combination of a plurality of bimorph piezoelectric actuators, and the entirety of the mechanical structure is taken as a piezoelectric actuator. This mechanical structure has a structure where a "bimorph piezoelectric element cross unit," into which a pair of bimorph piezoelectric elements are crossed in the form of the letter X, is taken as a basic unit; and where the basic unit is piled along the direction of displacement of an object. This basic unit (a bimorph piezoelectric element cross unit) has a structure of line symmetry where bimorph elements are crossed into the form of the letter X. As is evident from the shape of the letter X, the unit has an extremely-balanced, mechanically stable structure where two ends are formed in each of the upper and lower ends and where these ends provided at the two locations can receive or transmit force in a well-balanced manner. When there is adopted a structure where bimorph piezoelectric element cross units are piled into an even number of pieces (i.e., a structure into which bimorph piezoelectric element cross units are piled into an even number of layers), unwanted displacements—which have arisen in respective joints between the bimorph elements in a direction orthogonal to the direction of displacement of an object—are canceled by each other. Consequently, among the displacements having arisen in the respective bimorph elements, only the displacements having arisen in the direction of displacement of the object are merged together and extracted after having been amplified by the amount corresponding to the number of piled cross units. Therefore, the two movable ends of the piezoelectric actuator of the present invention can be linearly actuated over a sufficient distance in a desired direction without involvement of rotational stress. The distance of actuation can be adjusted by means of a voltage level applied to the respective bimorph elements and the number of piled bimorph piezoelectric element cross units. Since the piezoelectric actuator has a stable mechanical structure, high power is obtained (in other words, an object can be forcefully impelled). Since the piezoelectric actuator originally has a mechanism for amplifying displacement, members other than the mechanism (a displacement-increasing mechanism using a leaf spring or the like) are obviated. The piezoelectric actuator has a smaller number of components; is suitable for miniaturization; is easy to manufacture; and is advantageous in terms of cost. The piezoelectric actuator, which is formed from a structure involving a combination of bimorph elements, can be connected directly to the object, and does not involve any unwanted members. Hence, the characteristics of the bimorph element, such as high-speed response and high durability, can be exhibited without modifications. The object can be stably supported at two points (by two ends) on the lines which intersect the direction of actuation at right angles. Furthermore, displacements arise in the respective ends in only a desired direction, as mentioned previously. Hence, no rotational displacement arises, and the object can be actuated in a desired direction without use of the guide while correctly maintaining its position.

In one mode of the piezoelectric actuator of the present invention, when displacement is induced in the same direction in a pair of bimorph piezoelectric elements constituting each of the bimorph piezoelectric element cross units, displacements having arisen in the respective bimorph piezoelectric elements are combined together, whereby two movable ends at the extremity of the piezoelectric actuator can be actuated in a predetermined direction over a distance which exceeds the amount of displacement arising in one bimorph piezoelectric element.

Of the displacements having arisen in the respective bimorph elements, only the displacements in the direction of actuation of the object are merged by the piezoelectric actuator of the present invention, and the thus-merged displacements can be extracted after having been amplified by an amount corresponding to the number of piled bimorph piezoelectric element cross units. The piezoelectric actuator of the present invention has a structure where at least two cross units are vertically piled, and hence displacements which are at least double the displacements arising in one bimorph element can be caused to arise. Consequently, the two movable ends at the extremity of the piezoelectric actuator of the present invention can be linearly actuated in a predetermined direction over a distance which exceeds the amount of displacement arising in one bimorph piezoelectric element.

In an imaging element actuating device of the present invention, two movable ends at an extremity of the piezoelectric actuator of the present invention are fixed to an imaging element or a frame body which is actuated in conjunction with the imaging element, and the imaging element is actuated by means of driving force of the piezoelectric actuator.

As a result of the piezoelectric actuator of the present invention being used as a mechanical drive source for controlling a focus of the imaging device (for focusing purpose), high-speed, stable focus control is realized.

Moreover, in the imaging element actuating device of the present invention, the imaging element is made movable in respective directions of two axes which cross each other at right angles, by use of at least two piezoelectric actuators.

The two piezoelectric actuators of the present invention are arranged in two axes that cross each other at right angles, so that the imaging element can be independently actuated in two axial directions. Thereby, hand movements can be prevented effectively.

An imaging device of the present invention is equipped with the imaging element actuating device of the present invention.

Consequently, there can be implemented a high-performance camera which has high resolution; which is compact and lightweight; which can be incorporated into portable equipment; and which has a hand movement prevention function and offers easy operation.

Another mode of the imaging device of the present invention is also equipped with the imaging element actuating device of the present invention, and has the functions of: computing an amount of actuation of the imaging device induced by hand movements, on the basis of a result of detection performed by hand movement detection means; computing amounts of displacement of respective piezoelectric actuators required to actuate the imaging element to a focus position, on the basis of the computed amount of movement induced by the hand movements; inducing drive voltages corresponding to the amounts of displacement of the piezoelectric actuators on the basis of the computed amount of displacement; and applying the drive voltages to the respective piezoelectric actuators provided in the imaging element actuating device, to thus prevent the hand movements.

The amount of movement of the imaging element required to adjust a focus is computed from the signal output from the sensor for detecting hand movements, and the imaging element is actuated over a required distance by means of actuating the piezoelectric actuator, to thus prevent occurrence of hand movements. As a result, there can be implemented a high-performance camera which can also be incorporated into portable equipment; which has a hand movement prevention function; and which offers easy operation.

In another mode of the imaging device of the present invention, the piezoelectric actuators have the function of being able to actuate the imaging element in both a direction of an optical axis (direction X) and a direction (direction Y) orthogonal to the direction of the optical axis.

In another mode of the imaging device of the present invention, one end of the piezoelectric actuator is fixed to an equipment main body of the imaging device, and the other end of the same is fixed to one side plate of a movable frame which can be actuated in only the direction X in conjunction with the imaging element.

In another mode of the imaging device of the present invention, the hand movement detection means is an acceleration sensor.

ADVANTAGES OF THE INVENTION

According to the present invention, the object can be stably supported by two points (two ends) on lines which intersect the direction of actuation at right angles. Further, the respective ends are displaced in only the desired direction, and hence rotational displacement does not arise. The object can be actuated in a desired direction while properly maintaining its position without provision of a guide.

The piezoelectric actuator of the present invention has a unique mechanical structure, wherein a cross unit into which bimorph piezoelectric elements are crossed in the form of the letter X (assumes a structure of line symmetry which is dynamically stable) is taken as a basic unit; and wherein a plurality of the cross units are fixedly stacked into an even number of layers. Consequently, a high power piezoelectric actuator can be realized.

The displacement arising in one bimorph element can be extracted after having been amplified by the number of layers into which the elements are stacked. A sufficient amount of displacement (i.e., a sufficient actuation distance of the object) can be ensured.

Since the amount of displacement can be increased without use of the enlargement mechanism in contrast with the related-art device, the number of components can be decreased, which in turn miniaturizes the overall device. Further, the device is easy to manufacture and becomes advantageous in terms of cost.

The piezoelectric actuator can be connected directly to an object (an object of position control). Since an unwanted member is not interposed between the piezoelectric actuator and the object, superior characteristics of the bimorph element, such as high-speed response and high durability, can be exhibited without modifications.

When the piezoelectric actuator of the present invention is used as a mechanical drive source for controlling the focus of the imaging device (for focusing purpose), high-speed, stable focus control is achieved.

The two piezoelectric actuators of the present invention are arranged on the two axes which intersect each other at right angels, whereby the imaging element can be independently actuated in the directions of two axes. As a result, hand movements of the camera can be effectively prevented.

Recently, in association with an increase in the number of pixels (resolutions) of the imaging element, there is particularly expected realization of a compact, high power actuator which can effect high-precision, high-speed position control for preventing occurrence of hand movements. Since the piezoelectric actuator of the present invention is compact and slim, a camera, or the like, to be incorporated into a portable cellular phone can be readily provided. Moreover, since the actuator is of high power, a large imaging element can also be actuated, so that the above demands can be sufficiently satisfied.

Consequently, according to the present invention, there can be implemented a high-resolution, compact, lightweight, high-performance digital camera which can sufficiently prevent hand movements.

<Descriptions of the Reference Numerals>

Figure 1:
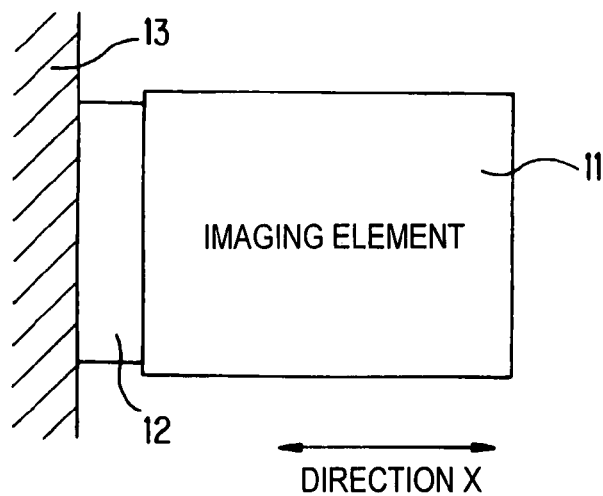
FIG. 1 is a view diagrammatically showing the configuration of a principal section of an imaging element actuating device using a piezoelectric actuator.

11 IMAGING ELEMENT
12 PIEZOELECTRIC ACTUATOR

-continued

<Descriptions of the Reference Numerals>

13 MAIN BODY OF IMAGING DEVICE
35a, 35b PIEZOELECTRIC CERAMIC
36 SPACER/NIPPING ELECTRODE
37c, 37d VOLTAGE APPLICATION ELECTRODES
71, 72 PIEZOELECTRIC ACTUATORS
72a, 73b SIDE PLATES OF MOVABLE FRAME MEMBER
300a, 300b DISPLACEMENT DETECTION MEANS (ACCELERATION SENSORS)
310a, 310b A/D CONVERSION MEANS
320 CAMERA ACTUATION LEVEL COMPUTING MEANS
330 ACTUATOR ACTUATION LEVEL COMPUTING MEANS
340a, 340b BOOSTER CIRCUITS

BEST MODES FOR IMPLEMENTING THE INVENTION

Embodiments of the present invention will be described hereinbelow by reference to the drawings.

First Embodiment

FIG. 1 is a view for schematically showing the configuration of a principal section of an imaging element actuating device using a piezoelectric actuator.

The imaging element actuating device shown in FIG. 1 is characterized by a configuration where an imaging element 11, which is an object of position control, is connected directly to one end of a piezoelectric actuator 12 of the present invention and the other end of the piezoelectric actuator 12 is fixed to main body equipment 13 (acting as a support member) of the imaging device.

Here, the imaging element 11 is, e.g., a CCD-type imaging element having about one megapixel; having an aspect ratio of 3:4; and transferring an image at a frame rate of 30 frames/sec.

An electrostrictive element formed from a piezoelectric (PZT) element is used as the piezoelectric actuator, and is configured so that displacement of 2.4 μ/V can be obtained as a K factor. However, the present invention is not limited to this configuration, and can be changed as appropriate.

When a voltage is applied to the piezoelectric actuator shown in FIG. 1, flexion and displacement arise in the actuator, and the displacement is transmitted directly to the imaging element 11. As a result, the imaging element 11 is actuated in a predetermined direction (in the direction X shown in FIG. 1) by an amount corresponding to the displacement having arisen in the piezoelectric actuator 12.

The piezoelectric actuator 12 is configured such that, e.g., the imaging element 11, actuates over 120 μm in an expanding and contracting manner in the direction X by means of a displacement of 1.2 μm/V.

Figure 2:
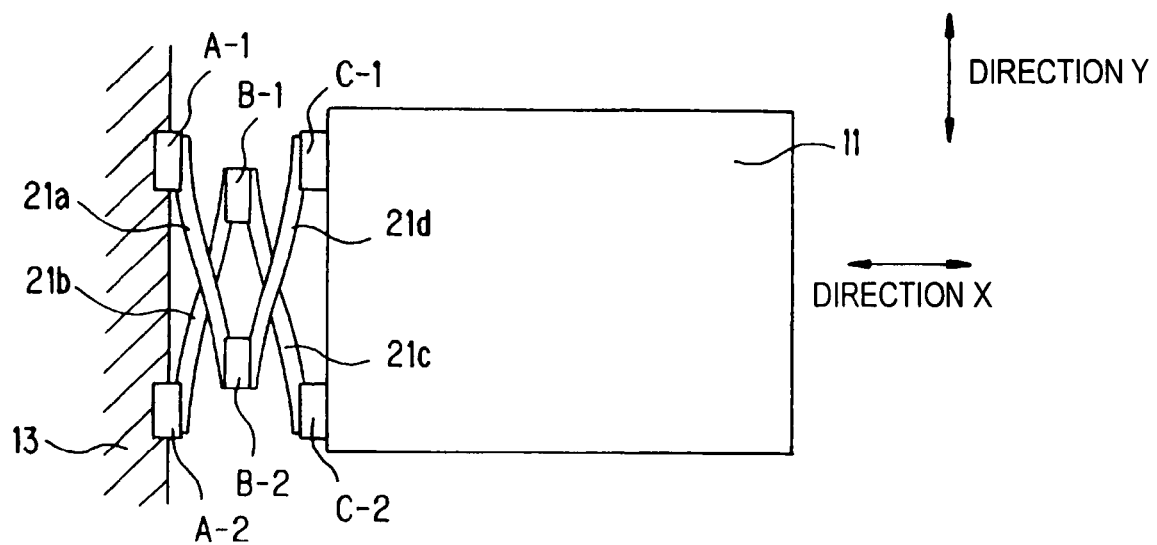
FIG. 2 is a view showing a specific example configuration of a piezoelectric actuator in the imaging element actuating device shown in FIG. 1.

FIG. 2 is a view showing a specific example configuration of the piezoelectric actuator employed in the imaging element actuating device shown in FIG. 1.

In FIG. 2, each of reference numerals 21a to 21d designates a bimorph piezoelectric element (bimorph element).

As illustrated, the bimorph piezoelectric elements 21a and 21b cross each other in the form of the letter X. Likewise, the bimorph piezoelectric elements 21c and 21d cross each other in the form of the letter X.

The most notable feature of the piezoelectric actuator of the present invention lies in that a structural body—where a pair of bimorph piezoelectric elements are combined together so as to cross each other in the form of the letter X (hereinafter called a "bimorph piezoelectric element cross unit" or merely a "cross unit")—is fixedly taken as a basic structural unit; and in that the structural units are piled one on the other in an even number, to thus form a mechanical structural body comprising a plurality of bimorph piezoelectric elements; and in taking the resultant entirety as one piezoelectric actuator.

Single ends (A-1, A-2) of the bimorph piezoelectric elements 21a, 21b are fixed to the equipment main body 13.

The other ends of the bimorph piezoelectric elements 21a, 21b and respective single ends of the bimorph piezoelectric elements 21c, 21d are connected (fixed) to each other by means of joint sections (B-1, B-2). The joint sections are movable ends which can be displaced in the direction X and the direction Y perpendicular thereto.

The other ends of the (two movable ends C-1, C-2 provided at the extremities) of the bimorph piezoelectric elements 21c, 21d are fastened to the back of the imaging element (an object of position control) 11.

The two movable ends (C-1, C-2) are displaced in only the direction X and are not displaced in the direction Y perpendicular to the direction X (i.e., the force used for causing such displacement does not arise). This is important and will be described later by reference to FIGS. 7 and 8.

The bimorph piezoelectric elements 21a to 21d are sigmoidally-actuated bimorph piezoelectric elements, and are constituted such that the directions of displacement become opposite in phase at the longitudinal center, which acts as a pivot point.

The structure of the sigmoidally-actuated bimorph piezoelectric element and a bimorph piezoelectric element cross unit will be specifically described by reference to FIGS. 3 and 4.

Figure 3:
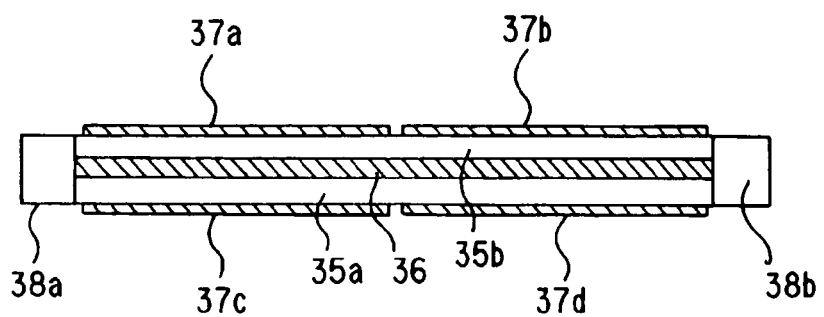
FIG. 3 is a cross-sectional view of one bimorph piezoelectric element acquired when no voltage is applied to the element.

FIG. 3 is a cross-sectional view of one bimorph piezoelectric element achieved when no voltage is applied to the bimorph piezoelectric element.

In FIG. 3, a left-side end section 38a is a stationary end, and a right-side end section 38b is a movable end.

As illustrated, this bimorph piezoelectric element has a structure where two sheets 35a, 35b of piezoelectric ceramic, which are polarized in a thicknesswise direction, are bonded together by way of the spacer/nipping electrode 36. Split voltage application electrodes 37c, 37d are formed on the back surface of the piezoelectric ceramic 35a, and split voltage application electrodes 37a, 37b are formed on the front surface of the piezoelectric ceramic 35b.

Figure 4:
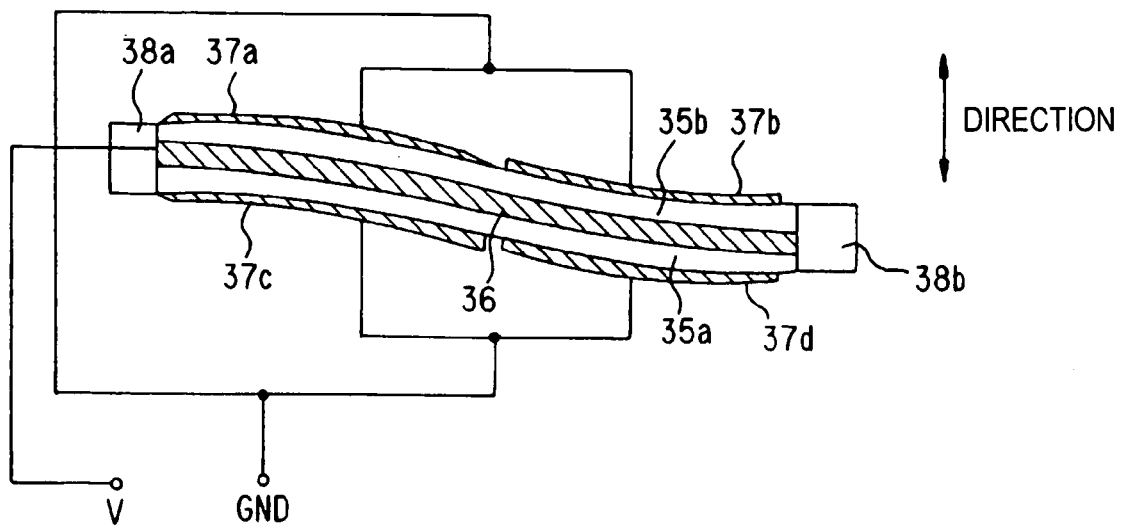
FIG. 4 is a cross-sectional view of one bimorph piezoelectric element acquired when a voltage is applied to the element.

FIG. 4 is a cross-sectional view of one bimorph piezoelectric element achieved when a voltage is applied to the element.

When a voltage V is applied to the bimorph piezoelectric element, the bimorph piezoelectric element is deformed as shown in FIG. 4, and the movable end 38b is translated in a direction perpendicular to the longitudinal direction (i.e., the direction Y) at all times.

Figure 5:
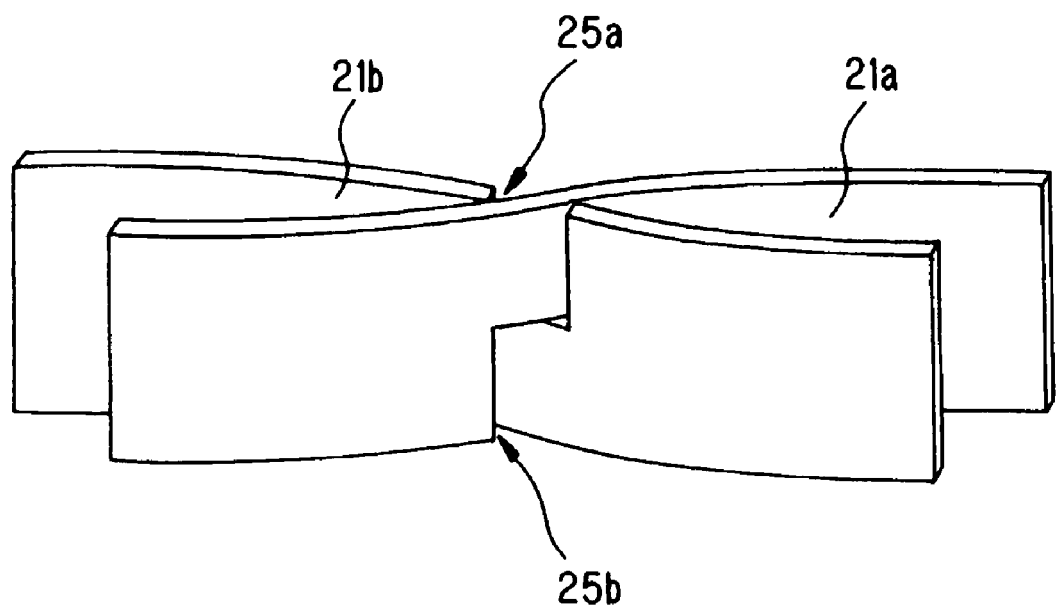
FIG. 5 is a perspective view of a cross unit of bimorph piezoelectric elements where a pair of bimorph piezoelectric elements are crossed in the form of the letter X (a state where the respective bimorph piezoelectric elements are deformed by application of a voltage)

FIG. 5 is a perspective view of a bimorph piezoelectric element cross unit, where a pair of bimorph piezoelectric elements are crossed in the shape of the letter X (a state where the respective bimorph piezoelectric elements are deformed on receipt of an applied voltage).

As illustrated, a cutout (25a) is formed in one direction in the longitudinal center of the bimorph piezoelectric element (21b), and a cutout (25b) is formed in another direction in the longitudinal center of the bimorph piezoelectric element (21a). The cutouts are engaged and crossed into the shape of the letter X. The two bimorph piezoelectric elements (21a, 21b) are engaged with each other at all times by way of the cutouts.

The bimorph piezoelectric element cross unit has a structure of line symmetry where bimorph elements are crossed into the shape of the letter X. As is evident from the letter X, the unit has an extremely-balanced, mechanically stable structure where two ends are formed in each of the upper and lower ends and where these ends provided at the two locations can receive or transmit force in a well-balanced manner.

The piezoelectric actuator of the present invention is formed from a mechanical structure body which is constructed by means of piling the bimorph piezoelectric element cross units in an even number (an even number of layers) and fixedly joining the units together.

Operation (displacement) of the piezoelectric actuator of the present invention will now be described in detail by reference to FIG. 6.

Figure 6:
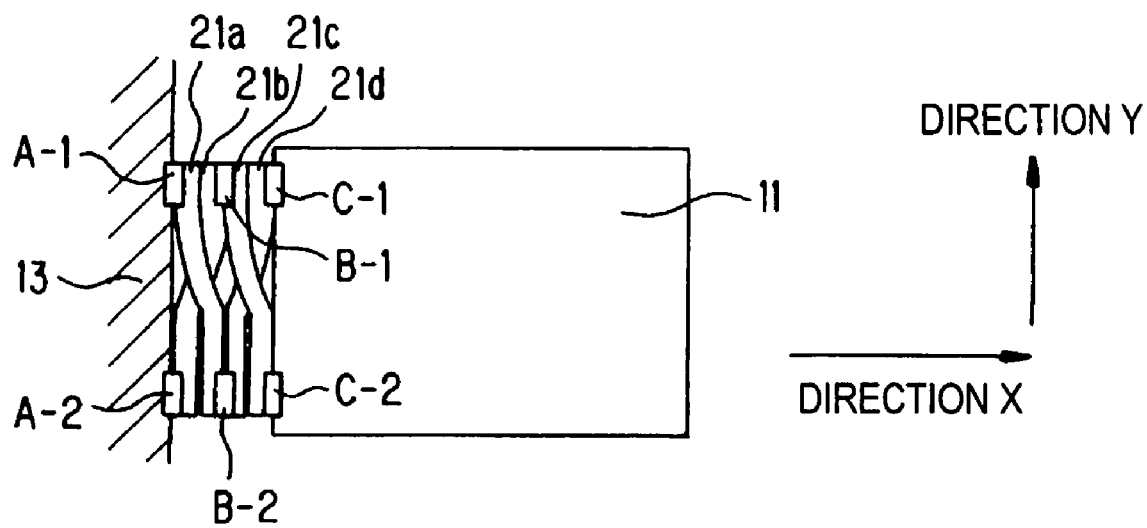
FIG. 6 is a view showing specific modes of the piezoelectric actuator in the imaging element actuating device shown in FIG. 1 acquired when the voltage is applied to the actuator and when the voltage is not applied to the actuator, wherein (a) shows a case where no voltage is applied and (b) shows a case where a voltage is applied.
Figure 6:
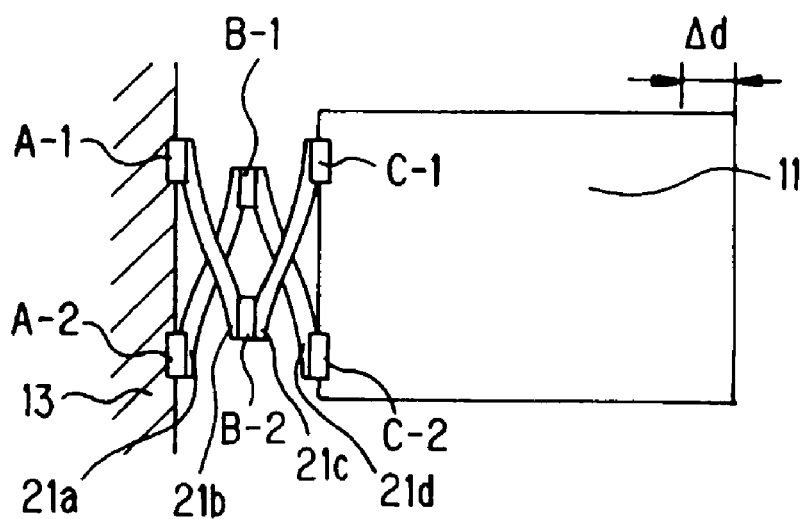

FIG. 6 is a view showing specific shapes which are assumed by the piezoelectric actuator of the imaging element actuating device shown in FIG. 1 when a voltage is not applied and when the voltage is applied to the imaging element actuating device. (a) shows a state where no voltage is applied, and (b) shows a state where a voltage is applied. FIG. 6(b) is substantially identical with FIG. 2.

As shown in FIG. 6(a), when no voltage is applied to the piezoelectric actuator, deflection and distortion do not arise in the respective bimorph piezoelectric elements 21a to 21d which cross each other in the shape of the letter X, and the bimorph piezoelectric elements remain overlapped.

As shown in FIG. 6(b), when a voltage is applied to the piezoelectric actuator, deflection and displacement arise in the respective bimorph piezoelectric elements 21a to 21d, and the position of the imaging element 11 is displaced in the direction X by Δd.

What is to be noted herein is that joint sections (B-1, B-2), where the other ends of the bimorph piezoelectric elements 21a, 21b and single ends of the bimorph piezoelectric elements 21c, 21d are joined together, are displaced in both the direction X and the direction Y perpendicular thereto (i.e., the distance between the joint sections B-1 and B-2 has changed) but the other ends (two movable ends: C-1, C-2 provided at the extremity of the piezoelectric actuator) of the bimorph piezoelectric elements 21c, 21d fastened to the back of the imaging element (an object of position control) 11 are displaced in only the direction X; and that stress, which will induce displacement in the direction Y perpendicular to the direction X, does not act on the other ends.

Consequently, the two movable ends (C-1, C-2) provided at the extremity of the piezoelectric actuator are displaced (linearly) in only the direction X. As a result, rotational stress does not act on the imaging element 11, and the imaging element can be stably actuated in the direction X (that corresponds to the direction of the optical axis) while maintaining its position. Therefore, a guide member becomes unnecessary.

Since this point is important, it will be specifically described by reference to FIGS. 7 and 8.

Figure 7:
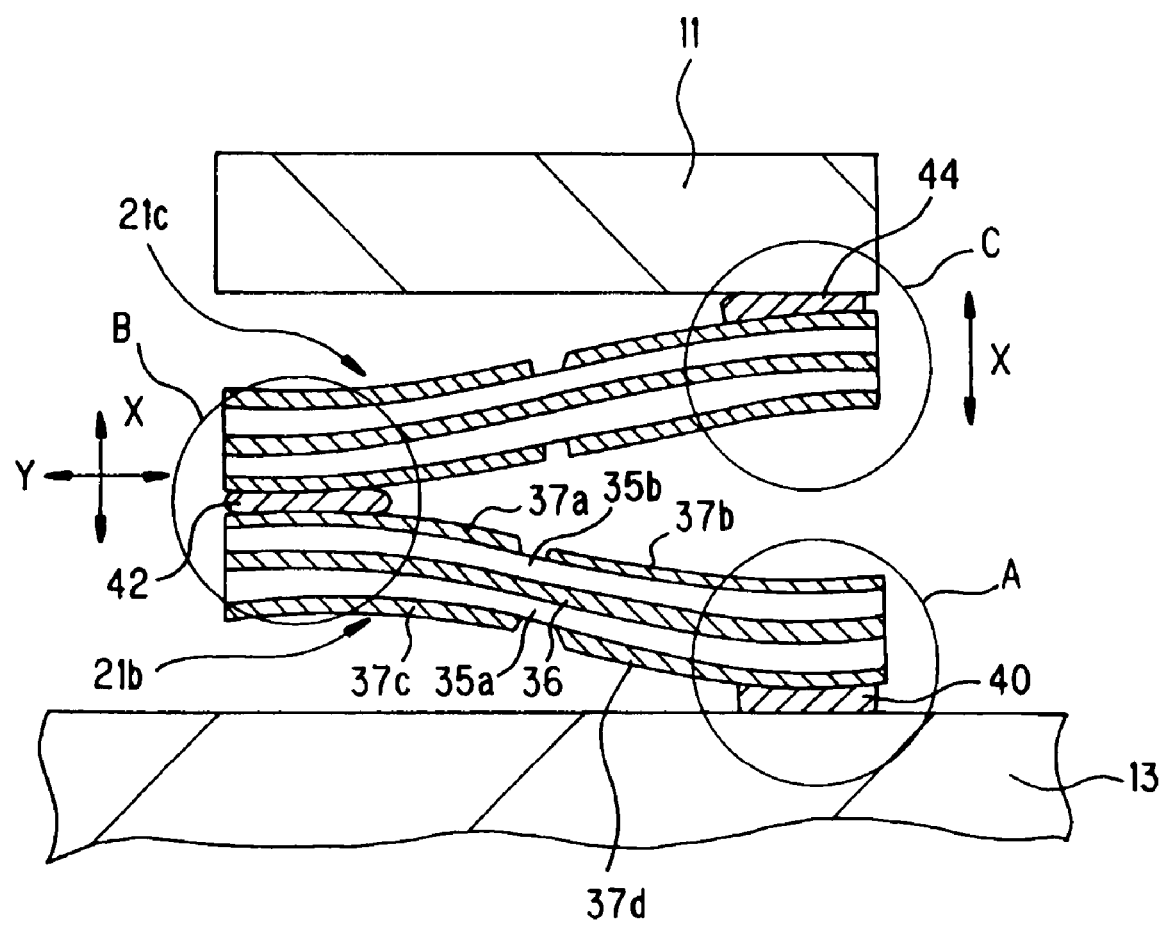
FIG. 7 is a cross-sectional view of the principal section of the piezoelectric actuator (acquired when a voltage is applied to the actuator) for describing a difference between displacement, which is induced by a joint section (B) of upper and lower bimorph piezoelectric elements, and displacement induced by a fixed section (C), which is present between the upper bimorph piezoelectric element and the imaging element.

FIG. 7 is a cross-sectional view of the principal section of the piezoelectric actuator (acquired when a voltage is applied to the actuator) for describing a difference between the displacement of the joint section (B) between the upper and lower bimorph piezoelectric elements and the displacement of the fixed section (C) between the upper bimorph piezoelectric element and the imaging element.

FIG. 7 shows only one extracted from the pair of bimorph elements that cross in the form of the letter X, in consideration of ease of comprehension.

In FIG. 7, those elements which are the same as those shown in the foregoing drawings are assigned the same reference numerals. In FIG. 7, reference numerals 40, 42, and 44 designate an adhesive (fixing material).

A fixed section (A) encircled at a lower right position in FIG. 7 is a fixed connection end between the lower bimorph piezoelectric element (21b) and the equipment main body 13 (acting as a support member) of the imaging device.

The joint section (B) encircled in the left center of FIG. 7 is a joined end between the upper and lower bimorph piezoelectric elements (21c, 21b).

A fixed section (C) encircled at an upper right position in FIG. 7 is a fixed end between the upper bimorph piezoelectric element (21c) and the imaging element 11.

The joint section (B) is displaced in the directions X and Y, but the fixed section (C) is displaced in only the direction X. Stress, which will induce displacement in the direction Y, does not act on the fixed section. Therefore, the imaging element 11 can be actuated straightforward in the direction X while maintaining its position, and rotational displacement of the optical axis does not arise.

Figure 8:
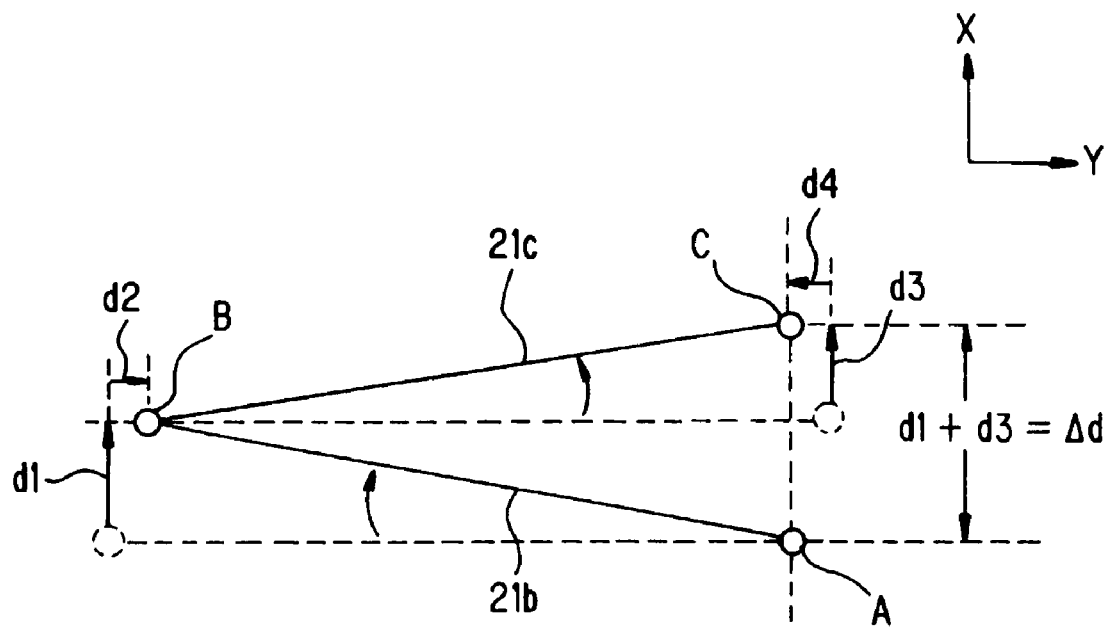
FIG. 8 is a schematic diagram for describing a reason why only displacement in the direction X has arisen in the fixed section (C) shown in FIG. 7 and why stress, which attempts to induce displacement in the direction Y, does not act.

FIG. 8 is a diagrammatic representation for describing the reason why the fixed section (C) in FIG. 7 is displaced in only the direction X and why stress, which will induce displacement in the direction Y, does not act on the same.

For convenience of description, FIG. 8 shows the bimorph piezoelectric elements (21b, 21c) in the form of lines. The fixed sections (A, C) and the joint section (B) are designated by small circles.

In FIG. 8, positions of the respective bimorph piezoelectric elements (21b, 21c) achieved when no voltage is applied to the piezoelectric elements are denoted by dotted lines, and positions of the respective bimorph piezoelectric elements (21b, 21c) achieved when a voltage is applied to the piezoelectric elements are denoted by solid lines.

As illustrated, when the voltage is applied to the lower bimorph piezoelectric element 21b, the bimorph piezoelectric element 21b is bent in the direction X, and the joint section (B) is displaced in the direction X by "d1." Concurrently, the joint section is displaced in the direction Y (rightward in the drawing) by "d2."

Likewise, when a voltage is applied to the upper bimorph piezoelectric element 21c, the bimorph piezoelectric element 21c is bent in the direction X, and the fixed section (C) is displaced in the direction X by "d3" and concurrently in the direction Y (leftward in the drawing) by "d4."

Displacement "d2" arising in the joint section (B) in the direction Y (rightward in the drawing) and displacement "d4" arising in the fixed section (C) in the direction Y (leftward in the drawing) are equal in quantity (d2=d4) and opposite in direction. Hence, these displacements cancel each other.

Consequently, displacement arises in the fixed section (C) in only the direction X, and displacement in the direction Y (stress which will induce displacement in the direction Y) does not arise; in other words, the position of the movable end (C) at the extremity of the piezoelectric actuator in the direction Y remains unchanged regardless of whether or not a voltage is applied.

Here, d1+d3=Δd. Reference symbol Δd denotes the amount of displacement arising in the movable end when a voltage is applied to the structure—where a unit, which is formed by crossing a pair of bimorph piezoelectric elements in the form of the letter X, are stacked into two layers—, to thus induce displacement in the respective bimorph piezoelectric elements. Displacements (d1, d3) having arisen in the respective bimorph piezoelectric elements (21b, 21c) are understood to be merged together, to thus induce greater displacement.

From the above descriptions, it can be understood that the crossing unit is stacked in two stages (an even number of stages), so that the displacement having arisen in the movable end in the direction Y can be canceled.

In order to cancel displacement in the direction Y at the fixed point (the movable end) between the imaging element and the bimorph piezoelectric element, the bimorph piezoelectric element cross units must be stacked in at least two layers (i.e., an even number of layers).

In the case of only one bimorph piezoelectric element cross unit (one layer) (or in the case where the bimorph piezoelectric element cross units are stacked in an odd number of layers), the two movable ends at the extremity are displaced in the direction Y as well as in the direction X and cannot be fastened to the imaging element 11.

When the movable ends are forcefully fixed to the imaging element 11, force—which will induce displacement in the direction Y—is added to the imaging element 11, which in turn disturbs the position of the imaging element 11 to thereby induce displacement of the optical axis (rotational displacement).

Consequently, according to the present invention, the bimorph piezoelectric element cross unit is piled up in "an even number (an even number of layers)," and the respective units are fixed together, to thus constitute a mechanical structure where a plurality of bimorph piezoelectric elements are combined with each other. The overall structure is taken as a single piezoelectric actuator.

As mentioned above, the cross unit that is formed from a pair of bimorph piezoelectric elements crossed into the form of the letter X is piled up in an even number; the units are fixed together; and the imaging element is attached to the movable ends of the thus-fixed units, whereby the imaging element 11 can be stably supported at two points and linearly actuated in a desired direction while maintaining its position.

In the related-art device, when the imaging element is actuated by means of the bimorph actuator, difficulty is encountered in supporting the imaging element at two points. However, according to the present invention, the imaging element can be supported at two points. Further, the two points are displaced over the same distance in only a desired direction. Accordingly, the imaging element can be actuated while maintaining its position. Consequently, a guide used for regulating actuation of the imaging element can be obviated.

The piezoelectric actuator of the present invention also yields the following special advantages.

Specifically, the bimorph actuator is arranged such that the amount of displacement is in proportion to an applied voltage, and such that displacement arises at a K factor of 1.2 μm/V. Consequently, when the value of the K factor is taken as "k," a relationship of $\Delta d = k \times E$ exists between the applied voltage E and displacement $\Delta d$.

This relationship exists when the two X-shaped bimorph piezoelectric elements assume the same K factor. When two X-shaped bimorph piezoelectric elements having different K factors are connected together, the overall K factor assumes a median value between the K factors.

Therefore, even when variations exist in the K factor of the bimorph material at the time of mass-production of this mechanism, the K factors are averaged by combination of the plurality of K factors. Thus, stable performance is obtained. Put another way, according to the present invention, variations in the device can be diminished.

In the present embodiment, the two pieces (layers) into which the bimorph actuators are crossed in the form of the letter X are fixedly stacked, and the imaging element is attached to the movable ends of the thus-fixed actuators.

However, the present invention is not limited to this embodiment. The above-mentioned advantage can be obtained by means of stacking the X-crossed units in an even number (an even number of layers). No specific limitations are imposed on the number of layers stacked.

Second Embodiment

Figure 9:
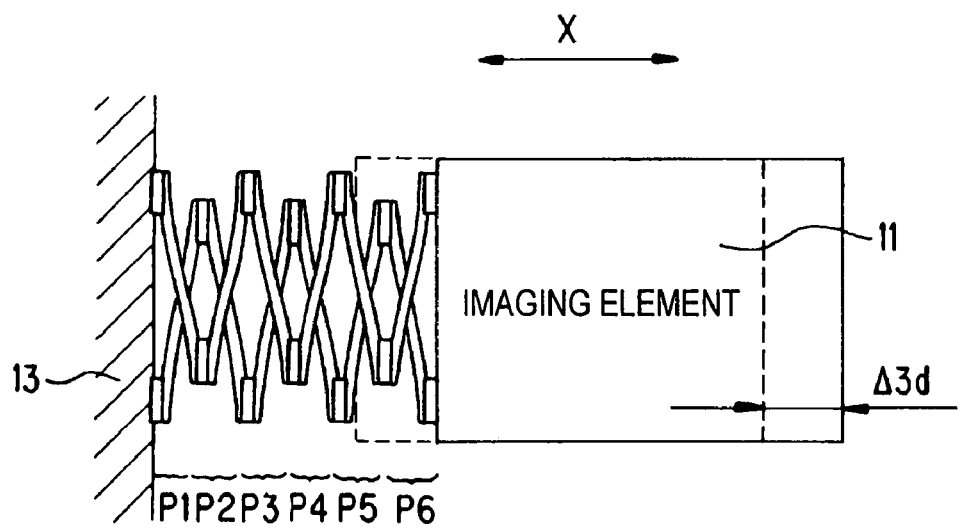
FIG. 9 is a view showing another specific example configuration of the piezoelectric actuator in the imaging element actuating device shown in FIG. 1.

FIG. 9 is a view showing another specific example configuration of a piezoelectric actuator in the imaging element actuating device shown in FIG. 1.

As illustrated, the characteristic configuration of the piezoelectric actuator lies in that cross units, into each of which a pair of bimorph piezoelectric elements are crossed, are fixedly piled up to six (six layers: P1 to P6 in the drawing denote the respective cross units).

In FIGS. 2 and 6, two cross units are stacked (the cross units are piled into two layers). In FIG. 9, the number of layers is tripled. In association with an increase in the number of layers, the amount of resultant displacement also assumes Δ3d and becomes tripled as compared with the amount of displacement acquired in FIGS. 2 and 6.

As mentioned above, the amount of displacement can be increased by means of increasing the number of layers to which the cross units are stacked. Consequently, the imaging element can be actuated over a sufficient distance.

This also signifies that the thickness of the piezoelectric actuator (a space required to store the actuator) in the direction of displacement can be adjusted by means of adjusting the number of layers into which the cross units are stacked, as required. Consequently, according to the size of a space which can be ensured, the thickness of the piezoelectric actuator can be adjusted by means of adjusting the number of layers into which the cross units are stacked, whereby the degree of freedom of design of the imaging device can also be increased.

Third Embodiment

Figure 10:
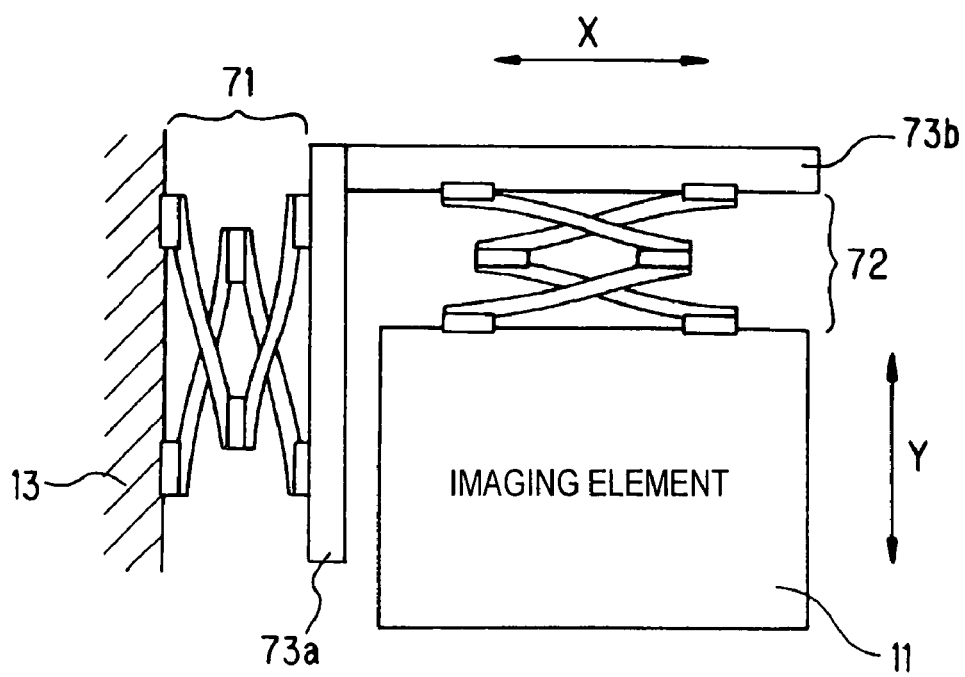
FIG. 10 is a view showing an example configuration of the principal section of the imaging element actuating device which is configured by use of the piezoelectric actuator of the present invention and has a hand movement prevention function.

FIG. 10 is a view showing an example configuration of the principal section of an imaging element actuating device which is configured by use of a piezoelectric actuator of the present invention and has a hand movement prevention function.

In the present embodiment, two piezoelectric actuators are arranged such that the directions, into which the movable ends at the extremities of the actuators are displaced, cross each other at right angles. By means of the mechanical driving force originating from the two piezoelectric actuators, the imaging element is freely actuated in both the direction of the optical axis (the direction X) and the direction (the direction Y) orthogonal to the direction of the optical axis.

In FIG. 10, reference numerals 71, 72 denote piezoelectric actuators of the present invention (an actuator having a structure where cross units, into each of which a pair of bimorph piezoelectric elements are crossed into the form of the letter X, are stacked into an even number and fixed together). Changes in the characteristics of the respective piezoelectric actuators (determined by design when necessary) are of no importance.

The piezoelectric actuators 71, 72 are arranged such that the directions of displacement of the actuators are aligned in the directions of two axes which cross each other at right angles. In the drawing, the direction X corresponds to the direction of the optical axis, and the direction Y corresponds to a direction perpendicular to the optical axis.

Single ends of the piezoelectric actuator 71 are fastened to the equipment main body 13 of the imaging device, and the other ends (two movable ends) are fixed to one side plate 73a of the movable frame which can be actuated in only the direction X in conjunction with the imaging element 11.

Likewise, single ends of the piezoelectric actuator 72 are fixed to the other side plate 73b of the movable frame which can be actuated in the direction X in conjunction with the imaging element 11. The other ends (two movable ends) are fixed to the imaging element 11.

By means of this configuration, the imaging element 11 can be actuated in two axial directions that cross each other at right angles. Specifically, hand movements in respective axial directions are detected by means of an acceleration sensor or the like, and the imaging element 11 is instantaneously actuated in the directions opposite the directions of the detected hand movements, to thus prevent the hand movements.

Figure 11:
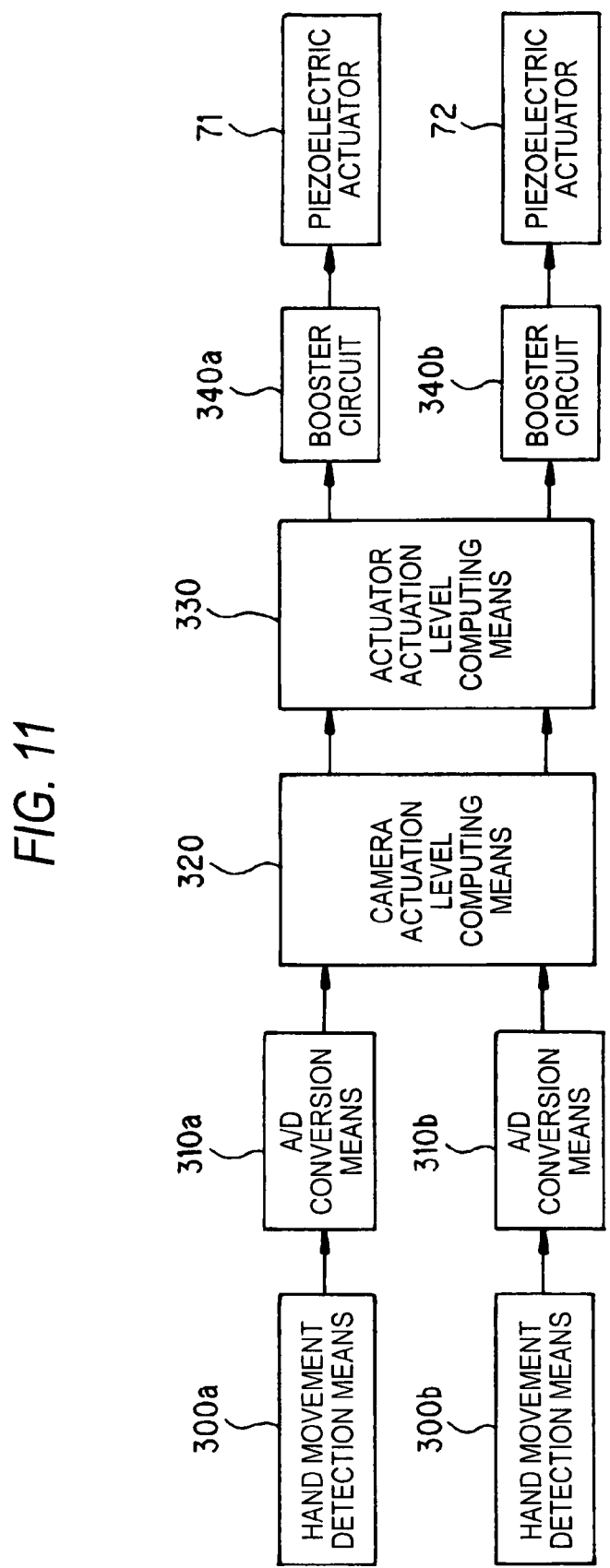
FIG. 11 is a view showing the configuration of the principal section of a digital camera (an imaging device) equipped with the imaging element actuating device shown in FIG. 10.

FIG. 11 is a view showing the configuration of the principal section of a digital camera (an imaging device) equipped with the imaging element actuating device shown in FIG. 10.

As illustrated, this digital camera comprises acceleration sensors (hand movement detection means) 300a, 300b for detecting hand movements in the direction of the respective two axes that cross each other at right angles; A/D conversion means 310a, 310b; camera actuation level computing means 320; actuator actuation level computing means 330; booster circuits 340a, 340b; and the piezoelectric actuators 71, 72 (the movable frame bodies 72a, 73b are omitted from FIG. 11) of the present invention shown in FIG. 10.

In the digital camera shown in FIG. 11, on the basis of the results of detection of hand movements performed by the hand movement detection means 300a, 300b, the camera actuation level computing means 320 computes the amount of actuation stemming from the hand movements in the digital camera.

Next, on the basis of the computed amount of actuation stemming from the hand movements, the actuator actuation level computing means 330 computes the amounts of displacement of the respective piezoelectric actuators 71, 72 required to actuate the imaging element 11 to the focusing point.

The booster circuits 340a, 340b cause a drive voltage corresponding to the computed amount of displacement of the piezoelectric actuator.

The drive voltage is applied to the respective piezoelectric actuators 71, 72. Consequently, the imaging element 11 is instantaneously actuated in the direction opposite the direction of the detected hand movements. Thereby, occurrence of out-of-focus is hindered, so that hand movements are prevented.

As mentioned above, according to the present invention, the camera to be incorporated into portable equipment can be additionally provided with a hand movement prevention function, so that the ease of use of the camera is remarkably enhanced.

As has been described, according to the present invention, the object can be stably supported by two points (two ends) on the lines which intersect the direction of actuation at right angles. Further, the respective ends are displaced in only the desired direction, and hence rotational displacement does not arise. The object can be actuated in a desired direction while properly maintaining its position without provision of a guide.

The piezoelectric actuator of the present invention has a unique mechanical structure, wherein a cross unit into which bimorph piezoelectric elements are crossed in the form of the letter X (assumes a structure of line symmetry which is dynamically stable) is taken as a basic unit; and wherein the cross units are fixedly stacked into an even number of layers. Consequently, a high power piezoelectric actuator can be realized.

The displacement arising in one bimorph element can be extracted after having been amplified by the number of layers into which the elements are stacked. A sufficient amount of displacement (i.e., a sufficient actuation distance of the object) can be ensured.

Since the amount of displacement can be increased without use of an enlargement mechanism in contrast with the related-art device, the number of components can be decreased, which in turn miniaturizes the overall device. Further, the device is easy to manufacture and becomes advantageous in terms of cost.

The piezoelectric actuator can be connected directly to an object (an object of position control). Since an unwanted member is not interposed between the piezoelectric actuator and the object, superior characteristics of the bimorph element, such as high-speed response and high durability, can be exhibited without modifications.

As mentioned above, according to the present invention, there is realized a piezoelectric actuator which can linearly actuate a large object, such as an imaging element, at high power in a predetermined direction without involvement of rotational displacement; which is capable of ensuring a large amount of actuation and is suitable for miniaturization and weight reduction; which is superior in terms of mechanical durability and manufacturing cost; and which has superior characteristics.

The piezoelectric actuator of the present invention is used as a mechanical drive source for controlling the focus of the imaging device (for focusing purpose), whereby high-speed, stable focus control is achieved.

The two piezoelectric actuators of the present invention are arranged on the two axes which intersect each other at right angles, whereby the imaging element can be independently actuated in the directions of two axes. As a result, hand movements can be effectively prevented.

Recently, in association with an increase in the number of pixels (resolution) of the imaging element, there is particularly expected realization of a compact, high power actuator which can effect high-precision, high-speed position control for preventing occurrence of hand movements. Since the piezoelectric actuator of the present invention is compact and slim, a camera, or the like, to be incorporated into a portable cellular phone can be readily provided. Moreover, since the actuator is of high power, a large imaging element can also be actuated, so that the above demands can be sufficiently satisfied.

Consequently, according to the present invention, there can be implemented a high-resolution, compact, lightweight, high-performance digital camera which can sufficiently prevent hand movements.

INDUSTRIAL APPLICABILITY

The present invention yields an advantage of the ability to implement a high-power piezoelectric actuator which can actuate a large object, such as an imaging element, in a predetermined direction over a large distance. Accordingly, the present invention can be utilized for a piezoelectric actuator and a camera (an imaging device) having a hand movement preventing function.

The invention claimed is:

1. A piezoelectric actuator having a structure where a plurality of bimorph piezoelectric element cross units, into each of which a pair of bimorph piezoelectric elements are crossed into a form of a letter X, are stacked into an even number and fixed together.

2. The piezoelectric actuator according to claim 1, wherein, when displacement is induced in each of the bimorph piezoelectric element cross units, displacements having arisen in the respective bimorph piezoelectric element cross units are combined together, whereby two movable ends at the extremity of the piezoelectric actuator can be actuated in a predetermined direction over a distance which exceeds the amount of displacement arising in one bimorph piezoelectric element cross unit.

3. An imaging element actuating device, wherein
two movable ends at an extremity of the piezoelectric actuator defined in claim 1 or 2 are fixed to an imaging element or a frame body which is actuated in conjunction with the imaging element, and the imaging element is actuated by means of driving force of the piezoelectric actuator.

4. The imaging element actuating device according to claim 3, wherein the imaging element is made movable in respective directions of two axes which cross each other at right angles, by use of at least two piezoelectric actuators.

5. An imaging device equipped with the imaging element actuating device defined in claim 3.

6. The imaging device of claim 5, further comprising:
a hand movement sensor, which outputs a detected amount of hand movement;
a camera actuation computer, which outputs an amount of detected camera actuation based on the detected amount of hand movement;
an actuator actuation computer, which outputs a control signal for the piezoelectric actuator based on the amount of detected camera actuation; and
drive voltage generators, which supply a displacement voltage to the piezoelectric actuator in response to the control signal.

7. The imaging device according to claim 6, wherein the piezoelectric actuators can actuate the imaging element in both a direction of an optical axis (direction X) and a direction (direction Y) orthogonal to the direction of the optical axis.

8. The imaging device according to claim 6, wherein one end of the piezoelectric actuator is fixed to an equipment main body of the imaging device, and the other end of the same is fixed to one side plate of a movable frame which can be actuated in only the direction X in conjunction with the imaging element.

9. The imaging device according to claim 6, wherein the hand movement sensor includes an acceleration sensor.

10. An imaging device equipped with the imaging element actuating device defined in claim 4.

11. The imaging device according to claim 10, further comprising:
a hand movement sensor, which outputs a detected amount of hand movement;
a camera actuation computer, which outputs an amount of detected camera actuation based on the detected amount of hand movement;
an actuator actuation computer, which outputs a control signal for the piezoelectric actuator based on the amount of detected camera actuation; and
drive voltage generators, which supply a displacement voltage to the piezoelectric actuator in response to the control signal.

12. The imaging device according to claim 11, wherein the piezoelectric actuators can actuate the imaging element in both a direction of an optical axis (direction X) and a direction (direction Y) orthogonal to the direction of the optical axis.

13. The imaging device according to claim 11, wherein one end of the piezoelectric actuator is fixed to an equipment main body of the imaging device, and the other end of the same is fixed to one side plate of a movable frame which can be actuated in only the direction X in conjunction with the imaging element.

14. The imaging device according to claim 11 wherein the hand movement sensor is an acceleration sensor.

15. A linear actuator, comprising:
one or more cross unit pairs, each cross unit pair comprising two cross units stacked in the direction of actuation, each cross unit comprising two bimorph piezoelectric elements crossed in the form of an X, wherein mutually contacting ends of bimorph piezoelectric elements are fixed together.

16. A linear actuator according to claim 15, wherein
each bimorph piezoelectric element has a cutout by which two crossed bimorph piezoelectric elements included in a cross unit are engaged and pivot.

17. A linear actuator according to claim 16, wherein
when a voltage is applied to a bimorph piezoelectric element, the direction of displacement becomes opposite in phase around the cutout location.

18. A linear actuator according to claim 15, wherein
the linear actuator comprises two or more cross unit pairs, which are stacked in the direction of actuation.

* * * * *